(12) United States Patent
Buffenbarger et al.

(10) Patent No.: US 9,933,461 B2
(45) Date of Patent: Apr. 3, 2018

(54) CURRENT-SENSING ASSEMBLY

(71) Applicant: GE Aviation Systems LLC, Grand Rapids, MI (US)

(72) Inventors: Ryan Lee Buffenbarger, New Carlisle, OH (US); Hao Huang, Troy, OH (US); Chad Joseph Brown, Kettering, OH (US)

(73) Assignee: GE Aviation Systems, LLC, Grand Rapids, MI (US)

( * ) Notice: Subject to any disclaimer, the term of this patent is extended or adjusted under 35 U.S.C. 154(b) by 326 days.

(21) Appl. No.: 14/180,830

(22) Filed: Feb. 14, 2014

(65) Prior Publication Data

US 2015/0233978 A1 Aug. 20, 2015

(51) Int. Cl.
*H05K 1/18* (2006.01)
*G01R 15/20* (2006.01)

(52) U.S. Cl.
CPC .................................. *G01R 15/202* (2013.01)

(58) Field of Classification Search
CPC .............................. H05K 7/026; B62D 5/0406
USPC ................ 361/752–753, 760–762, 807–810; 439/76.2
See application file for complete search history.

(56) References Cited

U.S. PATENT DOCUMENTS

| | | | |
|---|---|---|---|
| 7,021,418 B2 * | 4/2006 | Tominaga | B62D 5/0406 180/444 |
| 8,339,801 B2 * | 12/2012 | Tominaga | B62D 5/0406 361/752 |
| 2003/0151893 A1 * | 8/2003 | Meyer | H02M 1/44 361/688 |

FOREIGN PATENT DOCUMENTS

| | | |
|---|---|---|
| CA | 1290390 C | 10/1991 |
| CN | 203151361 U | 8/2013 |

* cited by examiner

*Primary Examiner* — Tuan T Dinh
(74) *Attorney, Agent, or Firm* — GE Global Patent Operation; William S. Munnerlyn

(57) ABSTRACT

A current-sensing assembly that includes a power module, for providing switchable power, having a current output extending through and directly away from the top exterior surface of the power module, a Hall sensor, capable of measuring current traversing through a conductor, having an opening, and the current output extending through the opening.

17 Claims, 2 Drawing Sheets

CURRENT-SENSING ASSEMBLY

BACKGROUND OF THE INVENTION

The insulated-gate bipolar transistor (IGBT) is a three-terminal power semiconductor device used as an electronic switch capable of high efficiency and fast switching. The IGBT combines the simple voltage-gate-drive characteristics of the metal-oxide-semiconductor field-effect transistors (MOSFETs) with the superior conduction characteristics, such as high-current and low-saturation-voltage capability, of bipolar transistors. Thus, IGBTs are well-suited for high voltage and/or high current applications. Large IGBT modules may consist of many devices in parallel and can have very high current handling capabilities in the order of hundreds or thousands of amperes with blocking voltages of 6000 V, with a switching frequency of the order of 1 to 40 kHz.

A Hall Effect sensor is a transducer that generates an output signal in response to a magnetic field. Hall Effect sensors may be used for proximity switching, positioning, speed detection, and AC or DC current sensing applications. Electricity carried through a conductor will produce a magnetic field that varies with traversing the conductor, and a Hall sensor can be used to measure the current without interrupting the circuit. In a closed-loop Hall Effect sensor, a current-carrying conductor is placed through an electrically-isolated aperture of a closed-loop magnetic core. The current traversing generates a magnetic field, which the Hall Effect sensor represents as an analogue or digital output signal indicative of the amount of current traversing the conductor.

Hall Effect sensors may be used to measure the current traversing a power transmission wire, such as an output wire of an IGBT. For example, the Hall Effect sensor is positioned downstream from the IGBT, and configured such that the transmission wire passes through the closed-loop of the sensor. The Hall Effect sensor senses the current traversing the transmission wire, and generates a signal indicative of that sensed current, which may be further provided back to the IGBT, or to additional power distribution system components.

BRIEF DESCRIPTION OF THE INVENTION

In one embodiment, the invention relates to a current-sensing assembly including a power module assembly having an elongated body with an exterior surface and a current output extending away from the exterior surface, and a hall sensor having an elongated body with an exterior surface and defining an opening. The power module assembly and hall sensor are in overlying relationship such the exterior surfaces are in a confronting relationship and the current output extends into the opening.

DESCRIPTION OF EMBODIMENTS OF THE INVENTION

Figure 1:
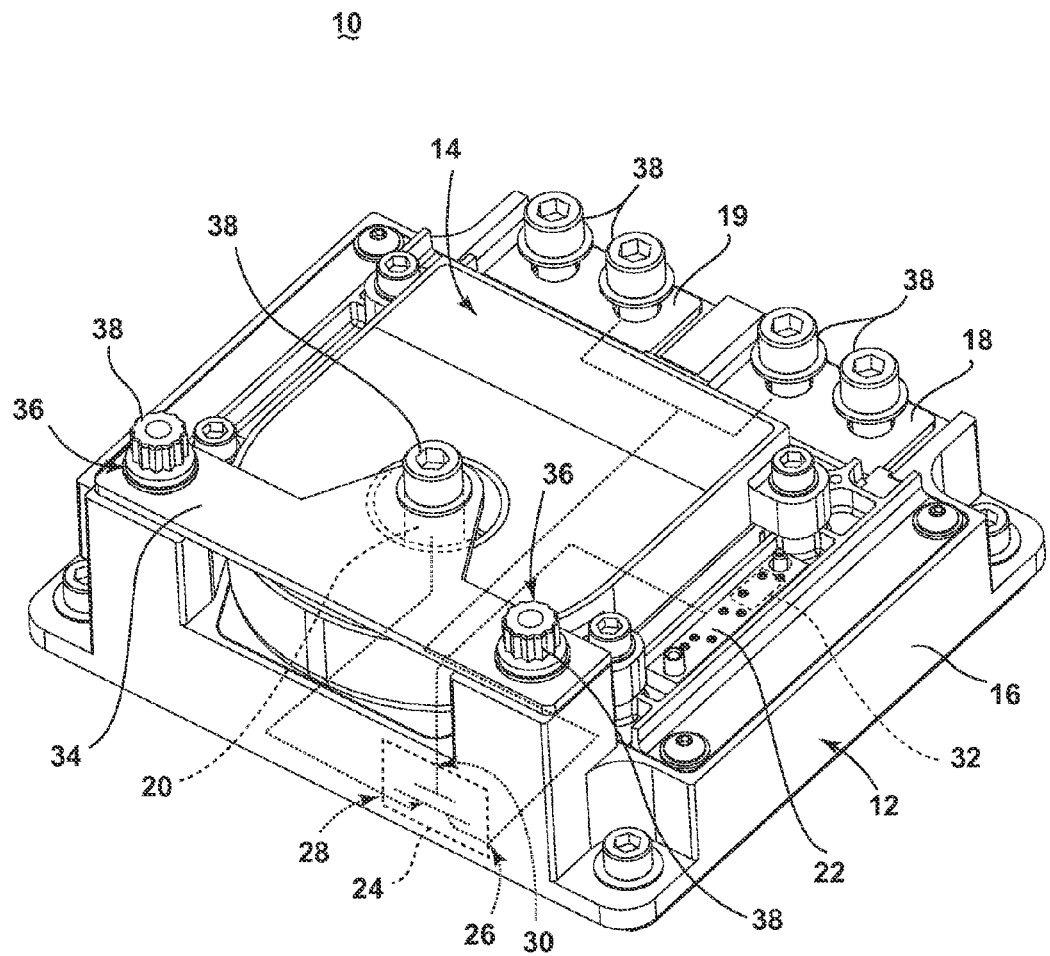
FIG. 1 is a perspective view of the current-sensing assembly, in accordance with one embodiment of the invention.

FIG. 1 illustrates one example of a current-sensing assembly, for example, a current-sensing power module assembly 10, in accordance with an embodiment of the invention. While a current-sensing power module assembly 10 is described, it is envisioned embodiments of the invention may be applicable in a plurality of different current-sensing assemblies. The current-sensing power module assembly 10 is shown comprising a power module assembly, such as an IGBT assembly 12, and a current sensor 14. The IGBT assembly 12 may further comprise a housing 16, at least one conductive input terminal, shown having a first and second input terminals 18, 19, at least one conductive output terminal 20, a gate drive assembly 22, and at least one IGBT circuit 24 (schematically illustrated as a single IGBT circuit 24 in dotted outline), which may be located within the housing 16. While an IGBT assembly 12 is shown, alternative power module assemblies are envisioned, wherein the alternative assemblies may include, for example, at least one metal-oxide-semiconductor field-effect transistor (MOSFET), at least one a silicon carbine (SiC) MOSFET, etc.

In the illustrated example, the IGBT circuit 24 may comprise a plurality of IGBT circuits 24 in an IGBT module. Each IGBT circuit 24 operates as a typical transistor. Thus in brief overview, each IGBT circuit 24 operates such that current provided to an emitter terminal 26 may be transmitted to a collector terminal 28 when a sufficient voltage is provided to a gate terminal 30, for example 5 VDC. In this example, the emitter terminal 26 is electrically coupled with at least one of the input terminals 18, 19, the collector terminal 28 is electrically coupled with the output terminal 20, and the gate terminal 30 is electrically coupled with the gate drive assembly 22; each coupling being illustrated in dotted line.

It is envisioned that the gate drive assembly 22 further comprises a controller 32 capable of controlling the gate terminal 30 of each respective IGBT circuits 24. The controller 32 may control the respective gate terminals 30, for example, according to a predefined programmatic routine, in response to sensed input, or power sharing algorithms. Additional controller 32 control methods are envisioned. Furthermore, embodiments of the invention are envisioned wherein one controller 32 may control a plurality of IGBT circuits 24 or IGBT assemblies 12 from a remote location, that is, away from the gate drive assembly 22.

While two input terminals 18, 19 are illustrated, an alternative number of input terminals are envisioned, for example, one or more terminals, which may provide similar or dissimilar electrical characteristics to the IGBT circuit or circuits 24. For instance, the first input terminal 18 may provide a positive DC voltage while the second terminal 19 provides negative DC voltage. Alternatively, the first terminal 18 may supply 30 Amps for a first set of IGBT circuits 24 while the second terminal 19 may supply 300 Amps for a second set of IGBT circuits 24.

The current-sensing power module assembly 10 may further comprise a conductive bus bar, shown as a T-shaped bus bar 34, electrically coupled with the output terminal 20 such that one or more electrical wires or connections may be electrically coupled with the output terminal 20. As shown, the T-shaped bus bar 34 provides for two available electrical output connections 36 for the output terminal 20.

The current-sensing power module assembly 10 is shown further comprising a plurality of mechanical connector or fasteners 38, for example, contractor fixing screws or threaded studs, for providing a means of electrically or physically coupling components together. For example, the output terminal 20 is shown coupled with the T-shaped bus bar 34 via a mechanical fastener 38, and mechanical fasteners 38 are shown provided on each of the available electrical connections 36. While mechanical fasteners 38 are shown, it is envisioned each of the electrical or physical couplings may be any suitable mechanical or non-mechanical fasteners. Other suitable mechanical fasteners, e.g. screws, bolts, nails, pins, etc., or alternatively, non-mechanical fasteners, such as welding or adhesive may be used as well.

Figure 2:
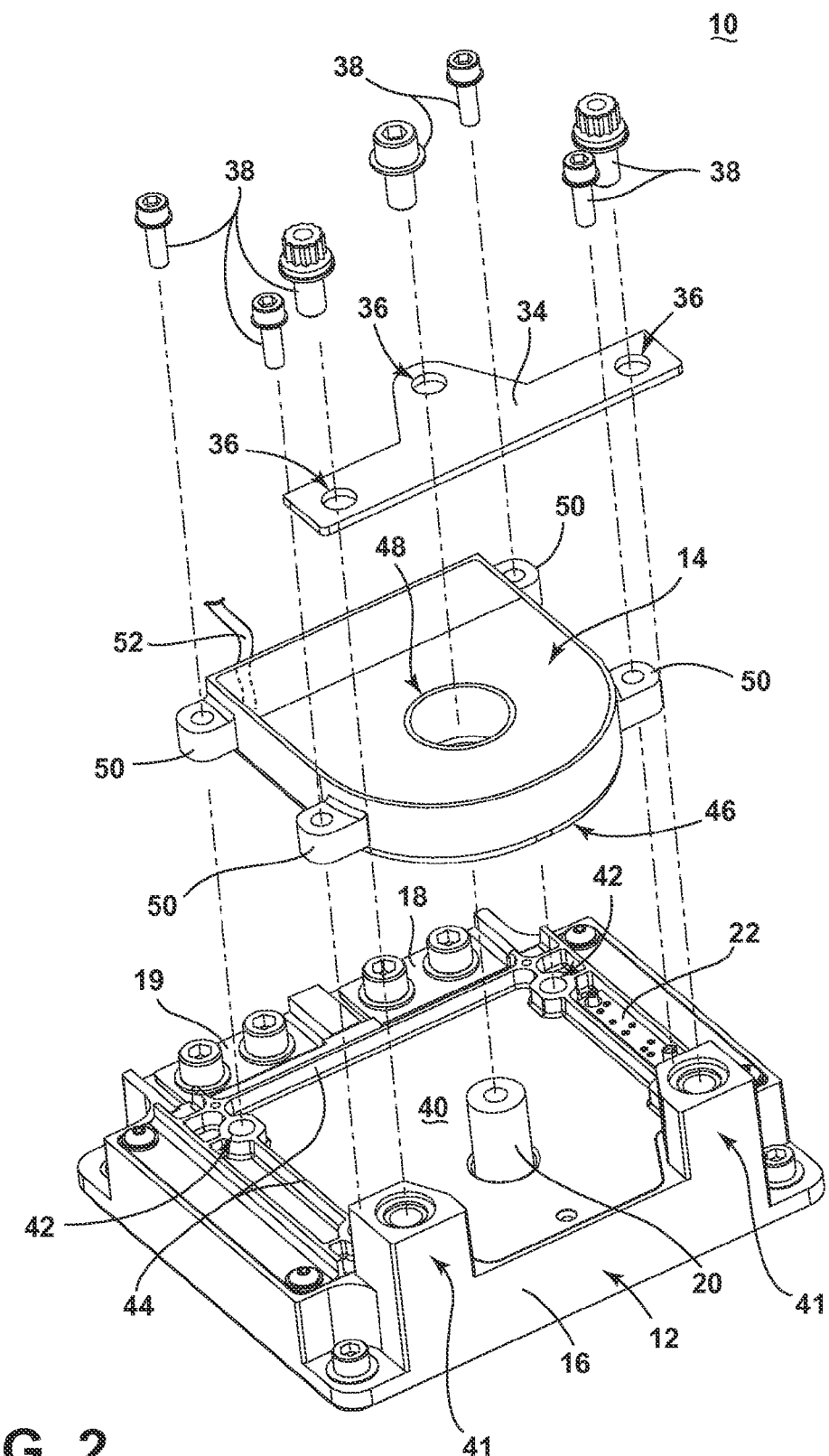
FIG. 2 is an exploded perspective view of the current-sensing assembly of FIG. 1 showing the Hall sensor mounting in relation to the IGBT assembly.

FIG. 2 illustrates an exploded perspective view showing the configuration of current sensor 14 in relation to the IGBT assembly 12, in accordance with one embodiment of the invention. In this illustration, it is readily discernable that the housing 16 of the IGBT assembly 12 further comprises a horizontally elongated body having an exterior top planar surface 40, and wherein the output terminal 20 may be substantially post-shaped, and extends normally away from the top surface 40. The IGBT assembly 12 may further comprise non-conductive mounting posts 41 extending away from the housing 16 in substantially the same normal extension as the output terminal 20, each post having an opening for receiving a mechanical fastener 38. The top surface may further comprise at least one mounting point 42, shown as configured to receive a mechanical fastener 38. The top surface 40 and/or the mounting points 42 may further define a structural supports 44 configured to reduce vibration between the top surface 40, the mounting points 42, and or components mounted to the points 42. Additionally, it is noted that the gate drive assembly 22 is located away from the output terminal 20 such that any current traversing through the output terminal is unlikely to affect, or is electromagnetically shielded from interference affecting any electrical operation of the gate drive assembly 22.

The current sensor 14 is shown to be a closed-loop Hall Effect current sensor having at least an elongated exterior bottom surface 46 and defining an opening 48 for receiving a conductor, and at least one mounting connector 50. As shown, the current sensor 14 is configured with plurality of mounting connectors 50 corresponding with the plurality of mounting points 42 on the top surface 40 of the IGBT assembly 12, and such that the placement of the opening 48 aligns to encircle and/or receive the output terminal 20.

The current sensor 14 may additionally comprise an communicative coupling or connection, such as a signal wire 52, located away from the opening 48 such that any current traversing through the opening 48 is unlikely to affect, or is electromagnetically shielded from interference affecting any signal traversing the signal wire 52. The signal wire 52 may be further coupled to provide a signal to, for example, one or more controllers, such as the controller 32 in the gate drive assembly 22, a controller in the IGBT assembly 12, or a controller remote from the current-sensing power module assembly 10.

The Hall Effect current sensor 14 is configured to operatively sense or measure a current traversing a conductor received in the opening 48, and provide a signal indicative of the traversing current to a destination, via, for example, the signal wire 52. While the current sensor 14 is described as "sensing" and/or "measuring" the current, it is envisioned that sensing and/or measuring may include the determination of a value indicative or related to the current characteristics, and not the actual current values. It is envisioned the current sensor 14 may be capable of providing an analogue or digital signal representative of the current traversing the conductor received in the opening 48.

When the current-sensing power module assembly 10 is assembled, the current sensor 14 and IGBT assembly 12 are positioned adjacently and in an overlying relationship, such that the top surface 40 of the assembly 12 and the bottom surface 46 of the sensor 14 are in a confronting relationship and the current output 20 extends into the opening 48 of the sensor 14. While confronting each other, it is envisioned the mounting points 42 of the IGBT assembly 12 align with the corresponding mounting connectors 50, such that, for example, a mechanical fastener received by each respective mounting point 42 and corresponding connector 50 is capable of removably or fixedly coupling the current sensor 14 with the IGBT assembly 12. It is noted in the embodiment described that a "confronting" relationship does not require the surfaces 40, 46 to be in adjacent or physical contact, and spacing between the surfaces 40, 46 may be envisioned. Alternatively, embodiments of the invention are envisioned wherein the surfaces 40, 46 are in adjacent or direct physical contact when the current sensor 14 overlies with the IGBT assembly 12.

It is envisioned that the assembling of the current-sensing power module assembly 10 is configured such that the current sensor 14 is electrically and/or magnetically isolated from the IGBT circuit 24. In this sense, it is noted the output terminal 20 is not in physical and/or electrical contact with the sensor 14, and for example, the top surface 40 and/or housing 16 of the IGBT assembly 12 may provide electromagnetic interference-shielding properties.

It is further envisioned that the output terminal 20 of the current embodiment extends entirely through the opening 48 of the current sensor 14 such that when assembled, the output terminal 20 may couple directly with the bus bar 34 above the sensor 14, or in embodiments not having a bus bar 34, directly to a further connector or component. It is further envisioned that the termination height of the output terminal 20, with height in reference to the direction of the terminal's 20 extension normally away from the top surface 40 of the IGBT assembly 12, is substantially the same termination height as the mounting posts 41, such that the assembly of the terminal 20 and posts 41 with the bus bar 34 results in a substantially horizontal configuration of the bus bar 34. It is envisioned that, collectively, the height of the current-sensing power module assembly 10, from the base of the housing 16 to the bus bar 34, coplanar with the direction of the terminal's 20 extension, is at most 1.61 inches. It is envisioned the height of the current-sensing power module assembly 10 is at least less than 1.7 inches.

The aforementioned IGBT circuits 24 may exemplify, for example, a single phase-leg configuration with dual IGBT switches, wherein the first switch may be defined by the first input terminal 18 and output terminal 20, and the second switch may be defined by the second input terminal 19 and output terminal 20, and each switch controllable by the gate drive assembly 22. In this sense, each switch provides a current output to the same output terminal 20.

It is envisioned the collective mounting features of the current sensing assembly 10 (i.e. the mechanical fasteners 38, mounting posts 41, mounting points 42, structural supports 44, etc.) provide for reduced vibration levels between the aircraft and the current-sensing power module assembly 10 components such that the components would be capable of surviving aircraft-level vibration.

The current-sensing power module assembly 10 operates so that current controlled by the IGBT circuit 24 and gate drive assembly 22 traverses the output terminal 20, through the bus bar 34, to be distributed via a power distribution system to the aircraft electrical loads, as needed. The current traversing through the output terminal 20 may be measured or sensed by the current sensor 14, which provides a signal indicative of the measured or sensed current. The IGBT assembly 12 may be, for example, further controlled, based on the measured or sensed current.

While the embodiments of the invention may be implemented in any environment using, for example, an insulated-gate bipolar transistor (IGBT) to provide power and/or switching functionality, it is current contemplated to be implemented in an aircraft environment. In this environment, an IGBT, or a plurality of IGBTs may be used to convert and/or distribute power in a power distribution system, providing high voltage, for example 3000 VDC, and/or high current, for example, 370 A, to be distributed among a plurality of electrical loads of the aircraft, such as actuators, pumps, lighting systems, etc. Determining the amount of power supplied by one or more IGBTs may be used for power management purposes, for example, to equally distribute power demands between IGBTs, or to verify and/or validate expected operations of the power distribution systems.

Many other possible embodiments and configurations in addition to that shown in the above figures are contemplated by the present disclosure. For example, one embodiment of the invention contemplates an additional current-sensing power module assembly 10 surface that overlays the top surface of the current sensor 14 and allows for electric coupling to the bus bar 34 via conductive mounting openings. Alternatively, the bus bar 34 may still be mounted opposite from the additional surface. In another embodiment, an open loop Hall Effect sensor may be used instead of the closed-loop sensor. Additionally, the design and placement of the various components may be rearranged such that a number of different in-line configurations could be realized.

The embodiments disclosed herein provide a current-sensing power module assembly for an IGBT assembly confronting a Hall sensor. One advantage that may be realized in the above embodiments is that the above described embodiments have an over low-profile design at 1.61 inches tall (as measured perpendicular to the confronting surfaces). The configuration and arrangement of the IGBT 12 and the current sensor 14 provides for them to be combined in an elongated shape having a relatively short height, which provides the overall low profile. Typically, power distribution systems use separate IGBT assemblies and current sensors which are individually optimized for space utilization, but are still required to operate together. Furthermore, the separation between the components often require separate mounting and often may not even be in the same plane with respect to the electrical connection of the center terminal, resulting in even less efficient use of the space. Embodiments of this invention solve the problem by optimizing the current sensor and the IGBT assembly as one assembly, with an integrated mounting for the current sensor, saving space and reducing mounting components costs and weight. The aforementioned space savings also allows for higher density power packaging, which can provide equal power in less space than conventional solutions. Alternatively, the space savings may provide higher power in the same spatial volume as conventional solutions.

The smaller packaging results in lower weight with a direct effect on aircraft weight and fuel savings. Embodiments of this invention also provide the user with fewer constraints with respect to power wire/bus bar routing since the combined IGBT assembly and current sensor act as a single unit rather than two units mounted separately and both requiring power wiring or busing. When designing aircraft components, important factors to address are size and weight. Reduced weight and size correlate to competitive advantages during flight.

Another advantage of the above-described embodiments is that the replaceability of the current-sensing power module assembly is streamlined such that the entire assembly can be swiftly replaced should either component fail. Alternatively, the replaceability of the either the current sensor or IGBT assembly in the current-sensing power module assembly is streamlined due to the single location of both components, allowing for reduced searching and testing for failed components at multiple locations in an aircraft.

Yet another advantage of the above-described embodiments is that the mounting features provide for reduced vibration, and thus, allows for an assembly that is robust enough to survive aircraft-level vibrations.

To the extent not already described, the different features and structures of the various embodiments may be used in combination with each other as desired. That one feature may not be illustrated in all of the embodiments is not meant to be construed that it may not be, but is done for brevity of description. Thus, the various features of the different embodiments may be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A current-sensing assembly comprising:
    a power module assembly having an elongated body with a set of sides and a top exterior surface and a current output extending through and directly away from the top exterior surface, wherein the top exterior surface is substantially perpendicular to the set of sides; and
    a Hall sensor having an elongated body with a first exterior surface and defining an opening;
    wherein the power module assembly and Hall sensor are substantially parallel and in overlying relationship such the top exterior surface of the power module and the first exterior surface of the hall sensor are in a confronting relationship and the current output extends into the opening; and
    a bus bar in a confronting relationship with a second surface of the Hall sensor, wherein the second surface of the Hall sensor is substantially parallel to the first surface, and the bus bar provides for at least one output connection to the current output.

2. The current-sensing assembly of claim 1 wherein the current output extends through the opening.

3. The current-sensing assembly of claim 1 wherein the exterior surface of the power module assembly further comprises at least one non-conductive mounting point.

4. The current-sensing assembly of claim 1 wherein a height of the current-sensing assembly, the height defined as coplanar with the direction of the current output extension, is less than 1.7 inches.

5. The current-sensing assembly of claim 1 wherein the power module assembly further comprises a gate drive assembly, and the gate drive assembly is mounted to the power module assembly away from the current output such that electromagnetic interference generated at the current output does not interfere with gate drive operation.

6. The current-sensing assembly of claim 1 wherein the Hall sensor further comprises a communicative coupling, and the communicative coupling is located on the Hall sensor away from the current output such that electromagnetic interference generated at the current output does not interfere with the communicative coupling.

7. The current-sensing assembly of claim 1 further comprising a third exterior surface confronting an exterior surface of the Hall Sensor, opposing the exterior surfaces in the confronting relationship, and in an overlying relationship with both the power module assembly and the Hall sensor.

8. The current-sensing assembly of claim 1 wherein the power module assembly further comprises at least one of an insulated gate bipolar transistor, a metal-oxide-semiconductor field-effect transistor (MOSFET), and a silicon carbine (SiC) MOSFET.

9. The current-sensing assembly of claim 2 wherein the bus bar further comprises a plurality of conductive output connections.

10. The current-sensing assembly of claim 3 wherein the exterior surface of the Hall sensor comprises at least one mounting connector corresponding to the at least one mounting point.

11. The current-sensing assembly of claim 9 wherein at least one of the plurality of output connections further comprises a post.

12. The current-sensing assembly of claim 10 wherein the at least one mounting point and at least one mounting connector are configured to reduce vibrations between the power module assembly and the Hall sensor.

13. The current-sensing assembly of claim 11 wherein the post is configured to couple with a mechanical connector.

14. The current-sensing assembly of claim 13 wherein the mechanical connector is a mechanical fastener.

15. A current-sensing assembly comprising:
a power module assembly that includes an elongated body having a set of sides and a top exterior surface, wherein the top exterior surface is substantially perpendicular to the set of sides, and at least one of the length or width of the top exterior surface is greater than a height of sides included in the set of sides;
a closed-loop Hall Effect current sensor having an elongated body with a first exterior surface, a second exterior surface that is substantially parallel to the first exterior surface, and defining an opening,
wherein the closed-loop Hall Effect current sensor is disposed on the power module assembly such that the top exterior surface of the power module and the first exterior surface of the hall sensor are in a confronting relationship;
an output terminal extending through and directly away from the top exterior surface of the power module assembly, and into the opening of the closed-loop Hall Effect current sensor; and
a bus bar in a confronting relationship with the second surface of the closed-loop Hall Effect current sensor, wherein the bus bar provides for at least one output connection to the current terminal.

16. The current-sensing assembly of claim 15, wherein the power module assembly further comprises at least one of an insulated gate bipolar transistor, a metal-oxide-semiconductor field-effect transistor (MOSFET), and a silicon carbine (SiC) MOSFET.

17. The current-sensing assembly of claim 15, wherein the elongated body of the power module assembly includes at least one non-conductive mounting post.

* * * * *